(12) United States Patent
Kovac

(10) Patent No.: US 9,455,670 B2
(45) Date of Patent: Sep. 27, 2016

(54) SCALABLE PERIPHERY FOR DIGITAL POWER CONTROL

(71) Applicant: Peregrine Semiconductor Corporation, San Diego, CA (US)

(72) Inventor: David Kovac, Arlington Heights, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 86 days.

(21) Appl. No.: 13/948,756

(22) Filed: Jul. 23, 2013

(65) Prior Publication Data

US 2015/0028953 A1    Jan. 29, 2015

(51) Int. Cl.
| | |
|---|---|
| H03F 1/02 | (2006.01) |
| H03F 3/26 | (2006.01) |
| H03F 3/45 | (2006.01) |
| H03F 1/22 | (2006.01) |
| H03F 3/193 | (2006.01) |
| H03F 3/21 | (2006.01) |
| H03F 3/24 | (2006.01) |
| H03F 3/72 | (2006.01) |

(52) U.S. Cl.
CPC .......... *H03F 1/0261* (2013.01); *H03F 1/0277* (2013.01); *H03F 1/223* (2013.01); *H03F 3/193* (2013.01); *H03F 3/211* (2013.01); *H03F 3/245* (2013.01); *H03F 3/72* (2013.01); *H03F 2200/15* (2013.01); *H03F 2203/7236* (2013.01)

(58) Field of Classification Search
USPC ................. 330/297–298, 127, 129, 134, 279
See application file for complete search history.

(56) References Cited

U.S. PATENT DOCUMENTS

| | | | |
|---|---|---|---|
| 6,784,748 B1 * | 8/2004 | Canyon et al. ............... | 330/296 |
| 7,091,772 B2 * | 8/2006 | Friedel et al. .................. | 330/10 |
| 7,638,991 B1 * | 12/2009 | Kobayashi ............ | H02M 3/337 323/272 |
| 7,741,822 B2 * | 6/2010 | Chen .................... | H02M 3/1584 323/272 |
| 7,910,993 B2 | 3/2011 | Brindle et al. | |
| 8,129,787 B2 | 3/2012 | Brindle et al. | |
| 8,179,109 B2 * | 5/2012 | Tang ................... | H02M 3/1584 323/272 |
| 2008/0111631 A1 * | 5/2008 | Shiikuma ...................... | 330/297 |
| 2014/0266460 A1 | 9/2014 | Nobbe et al. | |

\* cited by examiner

*Primary Examiner* — Hieu Nguyen
(74) *Attorney, Agent, or Firm* — Jaquez Land Greenhaus LLP; Martin J. Jaquez, Esq.; Alessandro Steinfl, Esq.

(57) ABSTRACT

A scalable periphery digital power control arrangement is presented. The scalable periphery digital power control arrangement comprises a plurality of PMOS transistors connected in parallel, where the plurality of transistors is operatively coupled to a voltage source. The plurality of PMOS transistors that is operatively coupled to the voltage source can operate as a controlled current source. Current flow from the voltage source can be controlled by a logic circuit, which sends a logic signal to enable or disable each individual PMOS transistor of the plurality of PMOS transistors connected in parallel. As more PMOS transistors are enabled, the current flow through the scalable periphery digital power control arrangement to the amplifier can increase.

21 Claims, 4 Drawing Sheets

SCALABLE PERIPHERY FOR DIGITAL POWER CONTROL

CROSS REFERENCE TO RELATED APPLICATIONS

The present application is related to scalable periphery amplifiers described in co-pending and commonly assigned U.S. patent application Ser. No. 13/797,779, entitled "Scalable Periphery Tunable Matching Power Amplifier", filed on Mar. 12, 2013, which is incorporated herein by reference in its entirety.

BACKGROUND

1. Field

The present application relates to power control and more specifically to methods and devices used to control an output power of an amplifier device.

2. Description of Related Art

One way to control the output power of an amplifier device is to control a power at a drain of an output stage of the amplifier device. Such a control can be used in any amplifying circuit that produces signals with constant envelope modulation, such as in a constant envelope cellular modulation scheme. By controlling a voltage to an amplifying circuit (e.g. drain of an output stage of an amplifier), output power control is achieved.

SUMMARY

According to a first aspect of the present disclosure an arrangement is presented, the arrangement comprising: an amplifier; and a power control circuit operatively coupled to the amplifier and adapted to be coupled to a power source, the power control circuit comprising: a plurality of transistors connected in parallel with one another, the plurality of transistors electrically connected between the power source and the amplifier; and a logic circuit electrically connected to each of the plurality of transistors, the logic circuit configured, during operation of the arrangement, to send a different logic signal to each transistor of the plurality of transistors to individually enable or disable each transistor of the plurality of transistors.

According to a second aspect of the present disclosure a method of output power control is presented, the method comprising: providing an amplifier; providing a power control circuit comprising: a plurality of transistors connected in parallel, the plurality of transistors adapted to be operatively connected between a power source and the amplifier; and a logic circuit electrically connected to each transistor of the plurality of transistors; generating logic signals from the logic circuit, where a number of logic signals corresponds to a number of the transistors connected in parallel; sending a different logic signal to each transistor of the plurality of transistors to individually enable or disable the particular transistor within the plurality of transistors, and based on the sending, setting an output power level of the amplifier.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Drain power control can be used in field effect transistor (FET) amplifier circuits that produce signals with constant envelope modulation, such as in a constant envelope cellular modulation scheme. Drain power control can be used to control a voltage generated from a voltage source, $V_{dd}$, to a desired circuit as a method to save current at lower power levels. This is done by providing enough power to an output stage of the amplifier (e.g. drain of an output FET) such as allowing amplification of an input signal without saturating the amplifier's output, but at the same time minimizing the unused power, thus minimizing the wasted energy (e.g. dissipated heat). Therefore, such a method attempts to control a drain power of the amplifier to be closer to a desired output power of the amplifier thus minimizing wasted energy. Methods of controlling output power through the drain of FETs can be more efficient than other types of power control methods, for example input power control.

For an input power control, a radio-frequency (RF) level going into an amplifier can be adjusted to control an output power while a bias current is held constant. This means that as the input power level varies, the wasted power within the amplifier varies as well, since the drain power is maintained constant while the output power varies. As such, this scheme cannot minimize the wasted power in the amplifier. On the other hand, drain power control can be limited to constant envelope modulation, since lowering the drain current/voltage can impact linearity (e.g. amplitude response) of the amplifier which becomes more apparent when amplifying signals with variable envelope modulation.

Figure 1:
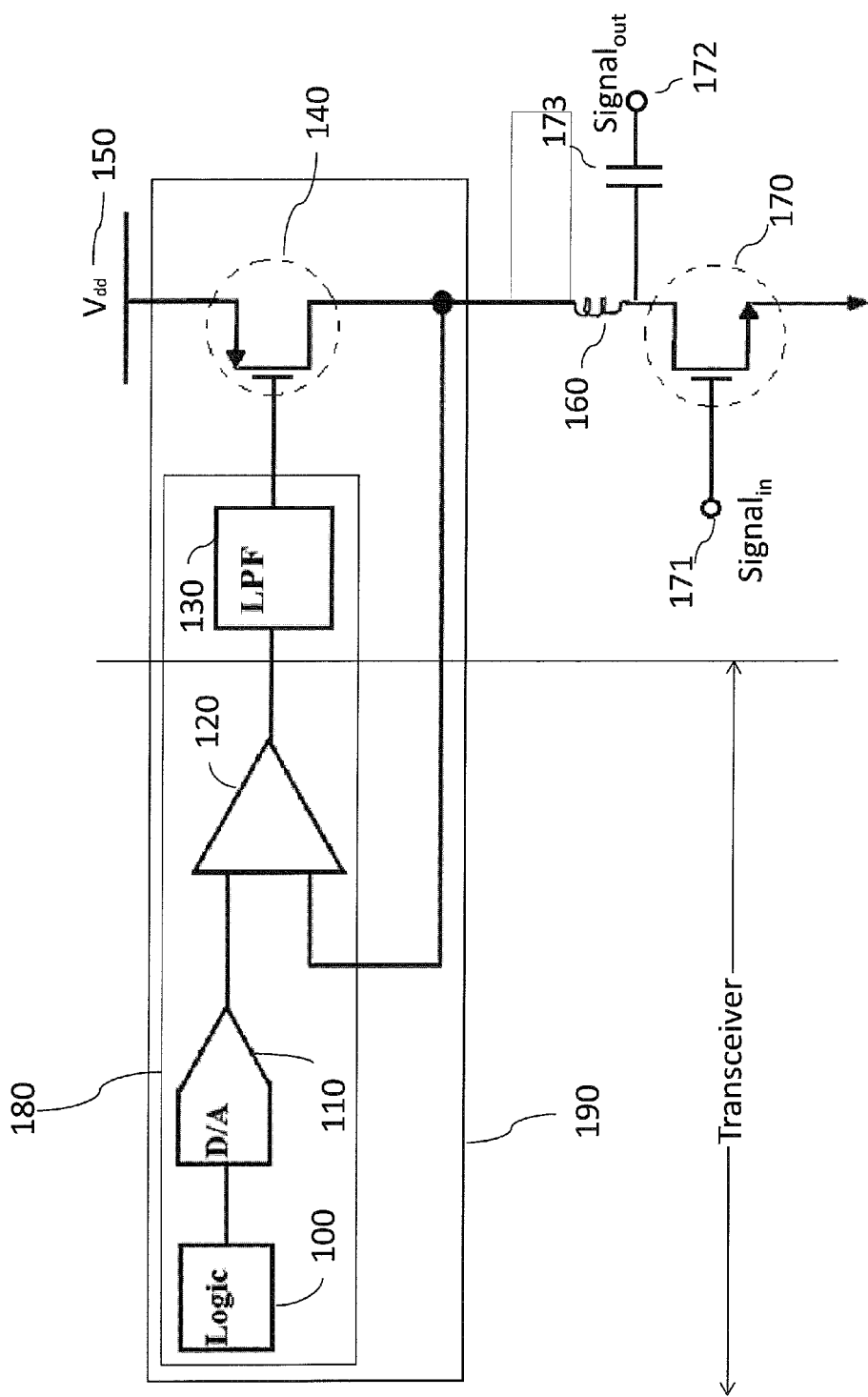
FIG. 1 (prior art) shows an implementation of a power control circuit utilizing a bias control circuit comprising an operational amplifier operating in a closed loop to control a voltage to an amplifier.

FIG. 1 shows a prior art implementation of a power control circuit (190) utilizing a bias control circuit (180). The bias control circuit (180) biases a PMOS transistor (140) connected to a voltage source $V_{dd}$ (150) at a source of the PMOS transistor (140). The bias control circuit (180) biases the PMOS transistor (140) in order to control a voltage drop across the PMOS transistor (140), and thus control a voltage to an amplifier (170), which can also be referred to as a power amplifier "final" device. In the embodiment of FIG. 1 the PMOS transistor (140) is used because the PMOS transistor (140) is a supply-side switch. In other embodiments a PNP transistor or an NMOS transistor may be used instead of the PMOS transistor (140). In the case where an NMOS transistor is used, the maximum voltage (and thus power) available to the drain of the amplifier (170) is reduced due to the Vgs drop across the NMOS transistor.

The power control circuit (190) can be connected to the final device (170) to control a voltage, derived from the voltage source $V_{dd}$ (150), to the final device (170). The final device (170) can be a unit cell of a scalable periphery amplifier, a pre-driver, a driver, or a final driver where the unit cell, the pre-driver, the driver, or the final driver comprises, for example, a single transistor or stacked transistors. The final device (170) can take an RF input signal at an input node (171). Furthermore, an RF output signal can be obtained at an output node (172). A capacitor (173) is used to prevent DC current from flowing to the output node (172) but the capacitor (173) still allows the RF signal to be obtained at the output node (172). More information on scalable periphery amplifiers is provided for example in U.S. patent application Ser. No. 13/797,779, entitled "Scalable Periphery Tunable Matching Power Amplifier", and filed on Mar. 12, 2013, which is incorporated herein by reference in its entirety.

Although the above passage provides an embodiment where the power control circuit (190) is connected to the final device (170), the power control circuit (190) could be used in other embodiments where control of a voltage is desired. The embodiments of the present disclosure could also be used as a regulator in this fashion (e.g. Low dropout (LDO) regulator).

The bias control circuit (180) used to bias the PMOS transistor (140) comprises a logic circuit (100), a digital-to-analog converter (110), an operational amplifier (120), and a low pass filter (130). In the past, the logic circuit (100) and the digital-to-analog converter (110) were implemented within a transceiver while the remaining components (e.g. the operational amplifier (120) and the low pass filter (130)) were implemented in the power amplifier. However, it is also possible to implement the digital-to-analog converter (110) in the power amplifier along with the operational amplifier (120) and the low pass filter (130). By doing so, the output of the transceiver can be purely digital. The skilled person may be well aware of the current technology trends and partitioning of such units within various products with the overall goal of minimizing device size, power consumption and number of input/output pins for example.

The voltage to the final device (170) is dependent on a biasing of the PMOS transistor (140), which in turn, depends on a voltage $V_{gs}$ between a gate and a source of the PMOS transistor (140). The bias control circuit (180) controls the voltage $V_{gs}$ of the PMOS transistor (140).

The power control circuit (190), shown in FIG. 1, generally works as a regulator controlling the voltage to the final device (170). The logic circuit (100) provides a digital power control ramping output signal to the digital-to-analog converter (110) which corresponds to a desired output power level of the amplifier.

The digital-to-analog converter (110) converts the digital power control ramping output signal to an analog signal to be provided to the operational amplifier (120). In turn, the operational amplifier (120) uses the analog signal from the digital-to-analog converter (110) as a first input. A second input to the operational amplifier (120) is obtained from the voltage present at a drain of the PMOS transistor (140) which thus creates a closed loop configuration by feeding a corresponding output (e.g. drain of (140)) to its second input. Through the closed loop configuration, the operational amplifier (120) drives its output such as to minimize the difference in voltage between its first and second input and thus forcing the voltage at an output of a PMOS device (i.e. the voltage present at the drain of the PMOS transistor (140)) to match the output of the digital-to-analog converter (110) (e.g. fed to the first input of the amplifier (120)).

Also, the output of the operational amplifier is sent through the low pass filter (130), which cleans up and smooths the digital-to-analog converter (110) output (e.g. performing anti-aliasing) and removes any noise that can become coupled to a control line in route from the transceiver. The low-pass filter (130) can be generally implemented such as to ensure no transient noise remains on an RF spectrum during power ramping.

An output of the low pass filter is fed to the gate of the PMOS transistor (140) which controls a voltage drop across the PMOS transistor and thus controls the voltage supply to the amplifier (170).

By way of example and not of limitation, a voltage of the analog signal output from the digital-to-analog converter (110) can be in the range of 0.1V to 1.2 V. Furthermore a range of voltages from which the operational amplifier (120) provides as an output (in relation to the digital-to-analog converter (110)) depends on a supply voltage which the operational amplifier (120) runs (not shown). For example, a simple operational amplifier that has a supply of $V_{dd}$ can usually drive within 0.1V of $V_{dd}$ down to 0.1V.

The bias control circuit (180) controls the voltage at the gate of the PMOS transistor (140). The voltage at the gate of the PMOS transistor (140) can go from $V_{dd}$ to 0V. If the gate voltage goes to 0V, then the control loop is railed and the power control is not operating in a closed loop. However, as long as the PMOS device (140) is sized large enough (e.g. increasing the W/L aspect ratio of the transistor), the voltage at the gate of the PMOS device (140) can be prevented from getting close to 0 V.

As previously mentioned, the voltage at the gate of the PMOS transistor (140) controls the voltage supplied to the amplifier (170). For example, as a voltage from an output of the digital-to-analog converter (110) increases, the voltage from the PMOS transistor (140) to the operational amplifier (120) also increases. This results in the output of the operational amplifier (12) operating at a lower drive because the voltage between the inputs provided by the digital-to-analog converter (110) and the voltage from the PMOS transistor (140) is negative. As the output of the operational amplifier (120) drives lower, the gate of the PMOS transistor (140) also is driven at a lower voltage level which results in the PMOS transistor (140) being turned ON more and thus a lower voltage drop across the source and drain terminals of the transistor (140) for a higher voltage provided to the drain of the amplifier (170). As a result with the PMOS being turned ON more, the voltage at the drain of the PMOS transistor (140) increases; this voltage from the drain of the PMOS transistor (140) being provided back to the operational amplifier (120). The process involving both voltage inputs to the operational amplifier (120), one being from the digital-to-analog converter (110) and one from the drain of the PMOS transistor (140) will continue until both the voltage inputs are equal (e.g. voltage at the drain of the transistor (140) becomes equal to the control voltage provided by the output of the D/A (110).

As the voltage at the gate of the PMOS transistor (140) decreases, an increasing amount of current from the voltage source $V_{dd}$ (150) can flow to the final device (170). The current flow occurs up to a point where the voltage at the gate of the PMOS transistor (140) drops to a threshold voltage where the PMOS transistor (140) transitions from operation in saturation to operation in triode. In triode, the PMOS transistor (140) no longer operates as a voltage controlled current source but rather as a voltage controlled resistor. The following equations can be used to illustrate the relationship of the current and the $V_{gs}$ found at the PMOS device (140):

$$V_{ds} < V_{gs} - V_{th} : I_d =$$
$$\mu n * \text{Cox} * \left(\frac{W}{L}\right) * [(V_{gs} - V_{th}) * V_{ds} - 0.5 * V_{ds}^2] \text{ - triode}$$

$$V_{ds} > V_{gs} - V_{th} : I_d = 0.5 * \mu n * \text{Cox} * \left(\frac{W}{L}\right) * (V_{gs} - V_{th})^2 \text{ - saturation}$$

where $\mu n$ is the effective mobility of electrons and $C_{ox}$ is the gate capacitance per unit area.

An inductor (160), connected between the PMOS transistor (140) and the final device (170), is referred to as a choke. The inductor (160) allows DC current to flow from the voltage source $V_{dd}$ (150) to the final device (170) while preventing AC current from flowing in the opposite direction.

Figure 2:
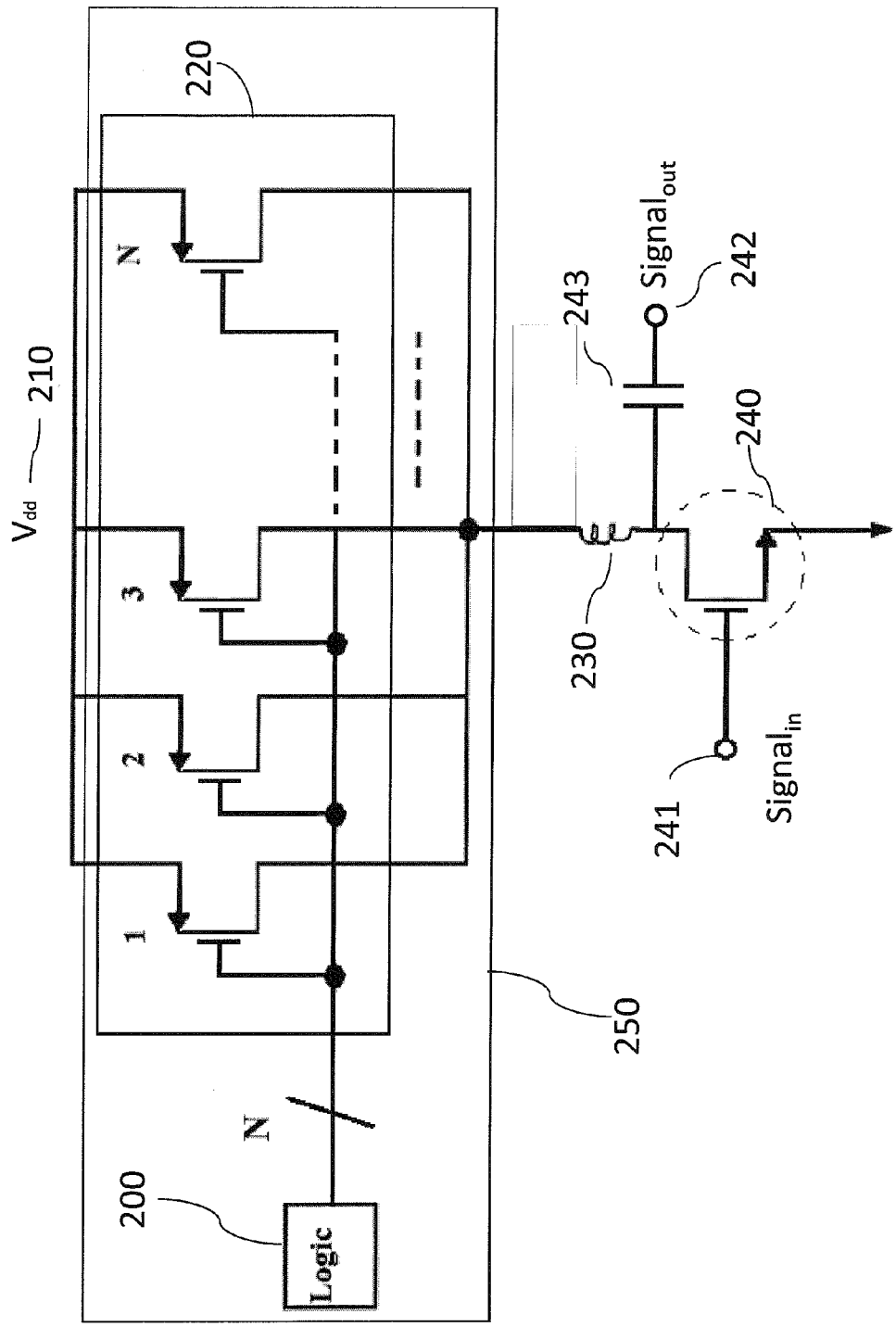
FIG. 2 shows a scalable periphery power control circuit according to an embodiment of the present disclosure utilizing a plurality of PMOS transistors connected in parallel.

FIG. 2 shows an embodiment according to the present disclosure of a scalable periphery power control circuit (250) comprising a plurality of PMOS transistors (220) connected in parallel as an alternative to the implementation shown in FIG. 1 to control a voltage to a final device (240), by setting a value of a resistance between the supply voltage $V_{dd}$ and the final device (240). A number of PMOS transistors (220) operate in either the triode mode to introduce a finite resistance between the supply voltage $V_{dd}$ and final device or in a switched OFF mode such as no current flow is provided through an OFF transistor and thus providing a high resistance path. Depending on the number of transistors activated (e.g. in the triode mode, low resistance) and the number of transistors deactivated (OFF, high resistance), the resistance created by the combination of the parallel transistors (220) can be controlled, which in turn and given a constant biasing current of the final device (240), a voltage drop across the parallel transistors is controlled to set an output bias voltage at the drain of the output device (240) which therefore sets an output power of the output device (240). The number of PMOS transistors (220) to be used in an embodiment, determine an output power (of the output device (240)) control step resolution in the embodiment. Therefore, depending on a desired resolution, an embodiment can implement an appropriate number of PMOS transistors (220). In other embodiments of the present disclosure, NMOS or PNP transistors can also be used in place of PMOS transistors of FIG. 2. PMOS transistors can be chosen because PMOS transistors allow for low drops from $V_{dd}$ ($V_{out} = V_{dd} - V_{ds}$). NMOS transistors, when used, would have a $V_{gs}$ drop ($V_{out} = V_{dd} - V_{gs}$). In yet other embodiments, each of the transistors (220) can be a cascaded/stacked arrangement of transistors to provide an increased voltage handling capability.

Figure 3:
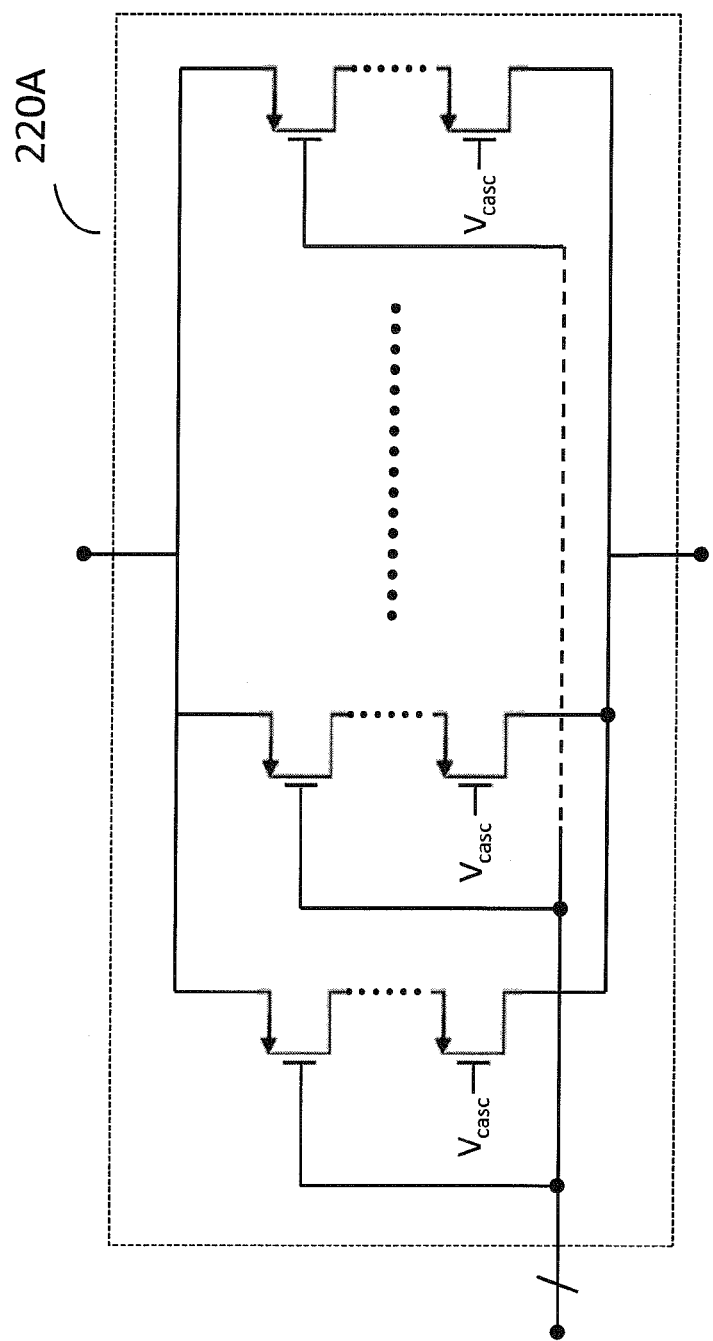
FIG. 3 shows an exemplary implementation of a plurality of stacked transistors connected in parallel for use in the scalable periphery power control circuit of FIG. 2.

FIG. 3 shows an embodiment according to the present disclosure of a plurality of stacked transistors (e.g. PMOS transistors) in a parallel configuration (220A) which can be used as a replacement to the arrangement (220) of FIG. 2. To be noted that in the stacked transistor arrangement of FIG. 3, one or more transistors from the stack can be biased separately by one or more biasing voltages (e.g. $V_{casc}$). Such a stacked (cascaded) arrangement of transistors as shown in FIG. 3 allows power handling capability greater than a power handling capability of a single transistor, because a voltage present across a single transistor (e.g. when the transistor is in an OFF state) may be sufficiently high to damage the one transistor, as opposed to dividing the voltage across the multiple stacked transistors of the embodiment depicted in FIG. 3. Stacked transistor arrangement (e.g. stacked switch) and associated benefits are described in pending applications and patents owned by the assignee of the present application. For example, FETs made in accordance with the HaRP enhancements are described in U.S. Pat. No. 7,910,993 B2, issued on Mar. 22, 2011, entitled "Method and Apparatus for Use in Improving Linearity of MOSFETs Using an Accumulated Charge Sink", and U.S. Pat. No. 8,129,787 B2, issued on Mar. 6, 2012, entitled "Method and Apparatus for Use in Improving Linearity of MOSFETs Using an Accumulated Charge Sink", both of which are incorporated herein by reference in their entirety.

Like in FIG. 1, the final device (240) of FIG. 2 can be a unit cell of a scalable periphery amplifier, a pre-driver, a driver, or a final where the unit cell, the pre-driver, the driver, or the final comprises, for example, a single transistor or stacked transistors. The final device (240) can take an RF input signal at an input node (241). Furthermore, an RF output signal can be obtained at an output node (242). A capacitor (243) prevents DC current from flowing to the output node (242) but still allows the RF signal to be obtained. Although the final device (240) is shown as a single transistor, the teachings of the present disclosure may be used by the skilled person for cases where the final device comprises a stack of transistors which may be further arranged in a cascode configuration, a plurality of transistors arranged in a differential configuration and a plurality of transistors arranged in a push-pull configuration, as well as other amplifying arrangements known in the art. As such the single transistor depicted in FIG. 2 should not be considered as a limiting factor of the present embodiment.

In the embodiment shown in FIG. 2, a logic circuit (200) sends individual digital signals to each transistor of the plurality of PMOS transistors (220). As stated above, the plurality of PMOS transistors (220) (operating in triode mode when switched ON or switched OFF to create a high resistance path) can vary in number depending on the desired resolution of the voltage (e.g. resistance created by the parallel transistors) to the final device (240). The voltage to the final device can be approximated to the difference between the $V_{dd}$ supply and the voltage drop across the parallel transistors due to the resistance of each individual PMOS transistor (220) and a biasing current (e.g. constant current) of the final device (240).

By controlling a number of PMOS transistors of the plurality of PMOS transistors (220) that are enabled (e.g. turned on) or disabled (e.g. turned off), an equivalent resistance of the parallel transistors can be controlled, which in turn control the voltage at the drain of the output device. For example, in the embodiment shown in FIG. 2, if all the PMOS transistors of the plurality of PMOS transistors (220) are turned ON, a biasing current will flow from the voltage source $V_{dd}$ (210) to the amplifier (240) though the combined parallel resistance of all the PMOS transistors (220) to create a voltage at the output terminal (e.g. drain) of the amplifier (204). If half of the plurality of PMOS transistors (220) are turned ON (e.g. other half is turned OFF), the biasing current will flow through the combined parallel resistance formed by half of the PMOS transistors (220), which is twice as large a resistance compared to the case where all the transistors are turned ON, and thus creating a smaller voltage at the output terminal (e.g. drain) of the output amplifier (240). The skilled person will require no further explanation on the relationship tying together the number of transistors ON and the voltage at the output terminal (e.g. drain) of the final device (240).

An inductor (230), which is connected between the scalable periphery power control circuit (250) and the final device (240), can be treated as a short circuit in the presence of DC power. The inductor (230) is referred to as a choke because it blocks AC current. In the embodiment shown in FIG. 2, the inductor (230) is used to allow DC current to flow from the scalable periphery power control circuit (250) (e.g. control voltage at the output terminal) to the amplifier (240) while preventing AC current from flowing in the opposite direction.

The logic circuit (200) of FIG. 2 controls the voltage to the final device (240) f by sending a logic signal to each individual PMOS transistor of the plurality of PMOS transistors (220) to enable or disable individual PMOS transistors within the plurality of PMOS transistors (220). In the embodiment shown in FIG. 2, the logic circuit (200) sends either a high signal (logic "1") or low signal (logic "0") to each of the PMOS transistors of the plurality of PMOS transistors (220). In particular, if the logic circuit (200) sends a high signal (logic "1"), the high signal will turn OFF a particular PMOS transistor (220) receiving the high signal. Similarly, if the logic circuit (200) sends a low signal (logic "0"), the low signal will turn ON (e.g. set in the triode region of operation) a particular PMOS transistor (220) receiving the low signal.

In an embodiment of the present disclosure, a logic high signal may be set to $V_{dd}$. A logic low signal may be set to $V_{dd}$-$V_{gs}$_max, where $V_{gs}$_max is a maximum voltage that a PMOS device (220) can handle without getting damaged.

The embodiment of the present disclosure, shown in FIG. 2, can take up less space on a die than the prior art implementation shown in FIG. 1. Furthermore, complexity and size of a transceiver could be reduced since a digital-to-analog converter and an operational amplifier (e.g. prior art of FIG. 1) would no longer be used in controlling the voltage to the final device. Such components typically take up relatively large die space. Furthermore, a direct digital control as per the embodiment of FIG. 2, could allow an output power to be ramped quickly compared to the embodiment of FIG. 1 because the analog loop can slow down a ramping process.

In some embodiments of the present disclosure, the logic circuit ramps the digital control to the PMOS devices (220) until a desired power is measured at the output of the amplifier. Alternatively, mapping tables defining output power at amplifier (240) versus number of ON PMOS devices (220) may be provided to set the output power to a desired level. In some embodiments according to the present disclosure, the mapping tables can include calibration offsets to compensate for manufacturing variation of specific devices/components used in the embodiment of FIGS. 2 and 4 and/or drifts associated with influencing parameters such as power variation (e.g. battery), temperature and the like. The skilled person will appreciate the degrees of flexibility in control and compensation provided by the digital power control implementation of FIGS. 2 and 4 as well as the speed of power control which is not possible, for example, in the prior art implementation of FIG. 1 where settling times associated with the analog servo controlled implementation are relatively large.

Figure 4:
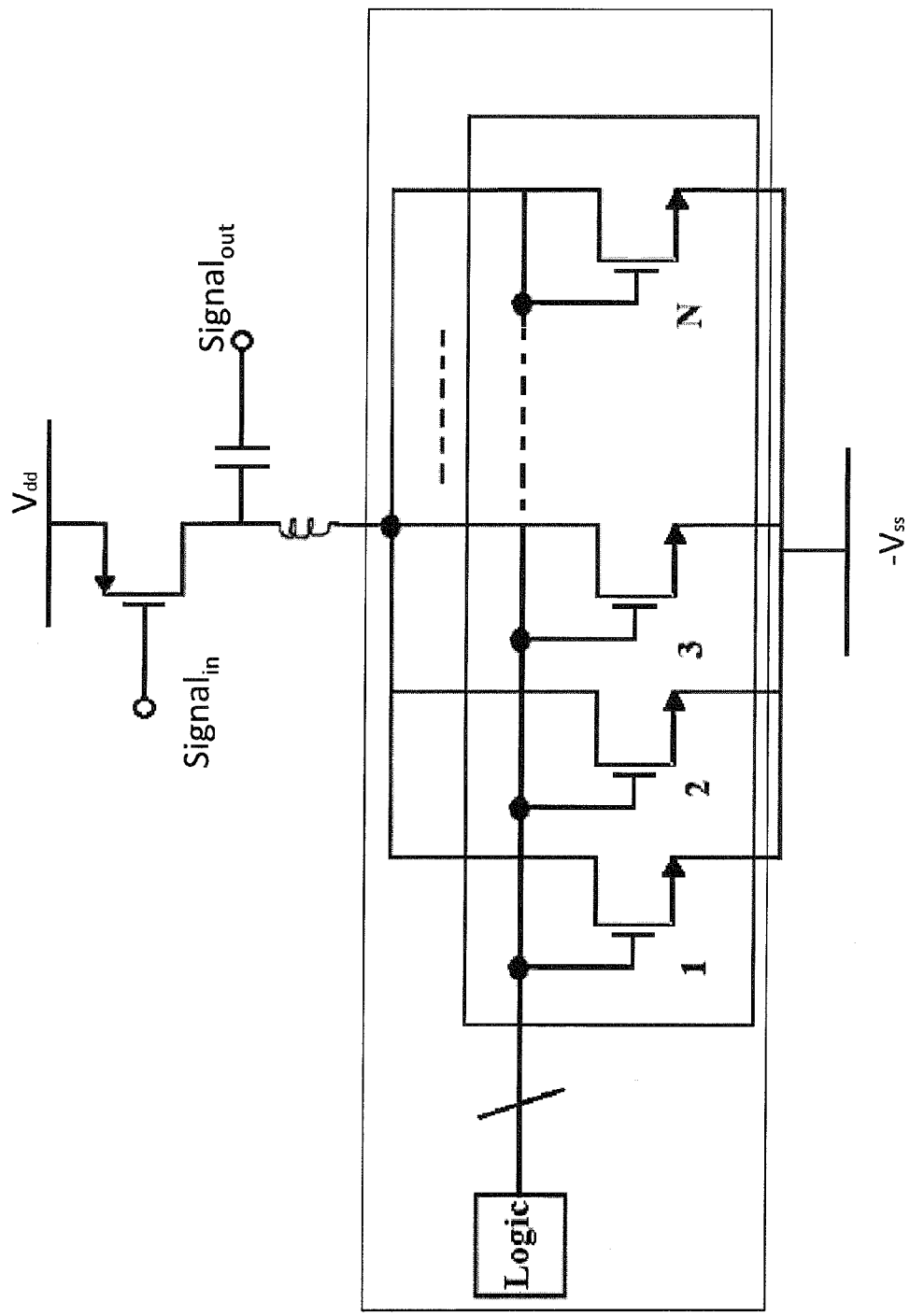
FIG. 4 shows a scalable periphery power control circuit according to an embodiment of the present disclosure utilizing a plurality of NMOS transistors connected in parallel.

In another embodiment of the present disclosure, as shown in FIG. 4, a scalable periphery power control circuit (350) comprising a plurality of NMOS transistors (320) connected in parallel can be used to control a voltage to a final device (340). In the configuration of FIG. 4, the final device (e.g. an output stage of the final device) comprises a PMOS transistor (340) whose drain power is provided by the scalable periphery power control circuit (350) under control of the logic circuit (300). Operation of the embodiment of FIG. 4 is very similar to one of FIG. 2 and requires no additional explanation for the skilled person.

Teachings of the present disclosure can be applicable in, for example, GSM devices wherein a GSM amplifier is used to amplify a signal according to a GSM modulation signal, as a replacement for previous methods of power control (or drain power control).

The examples set forth above are provided to give those of ordinary skill in the art a complete disclosure and description of how to make and use the embodiments of the scalable periphery for digital power control of the disclosure, and are not intended to limit the scope of what the inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. An arrangement comprising:
    an amplifier; and
    a power control circuit operatively coupled to the amplifier and adapted to be coupled to a power source, the power control circuit comprising:
        a plurality of transistors connected in parallel with one another, the plurality of transistors electrically connected between the power source and an output bias voltage node coupled to the amplifier; and
        a logic circuit electrically connected to each of the plurality of transistors, the logic circuit configured, during operation of the arrangement, to send a different logic signal to each transistor of the plurality of transistors to individually enable or disable each transistor of the plurality of transistors;
    wherein during operation of the arrangement, a voltage drop through an equivalent parallel resistance of the plurality of transistors of the power control circuit varies as a number of enabled transistors varies, such as to vary an output bias voltage at the output bias voltage node coupled to the amplifier to set a desired output power of the amplifier.

2. The arrangement according to claim 1, wherein:
    each logic signal is a logic high signal or a logic low signal, the logic circuit sends one of the logic high signal and the logic low signal to enable each transistor of the plurality of transistors, and the logic circuit sends the other of the logic high signal and the logic low signal to disable each transistor of the plurality of transistors.

3. The arrangement according to claim 1, wherein an enabled transistor of the plurality of transistors operates in a triode region of operation of the transistor defined by a corresponding equivalent resistance.

4. The arrangement according to claim 1 wherein the voltage drop through the equivalent parallel resistance of the plurality of transistors of the power control circuit, measured between the power source and the amplifier, decreases as the number of enabled transistors increases and increases as the number of enabled transistors decreases, respectively increasing and decreasing the output bias voltage provided to the amplifier.

5. The arrangement according to claim 1, wherein the plurality of transistors is one of: a) a plurality of PMOS transistors, h) a plurality of stacked PMOS transistors, and c) a plurality of stacked transistors.

6. A device comprising the arrangement according to claim 1, wherein the device comprises one or more of: a) a GSM amplifier, and b) an amplification path of a constant envelope modulation signal.

7. The arrangement according to claim 5, wherein the amplifier comprises a transistor.

8. The arrangement according to claim 7, wherein the transistor is an NMOS transistor.

9. The arrangement according to claim 5, wherein the amplifier comprises a stack of transistors.

10. The arrangement according to claim 5, wherein the amplifier is a final stage power amplifier.

11. The arrangement according to claim 1, further comprising an inductor operatively connected between the power control circuit and the amplifier.

12. The arrangement according to claim 5, wherein the gate of each of the plurality of transistors connected in parallel receives one of the different logic signals sent by the logic circuit.

13. The arrangement according to claim 5, wherein the drain of each transistor of the plurality of transistors connected in parallel is connected to a common drain node, where the common drain node is the output bias voltage node at which the output bias voltage is provided.

14. A method of output power control comprising:
providing an amplifier;
providing a power control circuit comprising:
a plurality of transistors connected in parallel, the plurality of transistors adapted to be operatively connected between a power source and an output bias voltage node coupled to the amplifier; and
a logic circuit electrically connected to each transistor of the plurality of transistors;

generating logic signals from the logic circuit, where a number of logic signals corresponds to a number of the transistors connected in parallel;

sending a different logic signal to each transistor of the plurality of transistors to individually enable or disable the particular transistor within the plurality of transistors, and based on the sending, setting an output power level of the amplifier;

wherein setting the output power level further comprises controlling a voltage drop across an equivalent parallel resistance of the plurality of transistors connected in parallel, wherein the equivalent parallel resistance of the plurality of transistors connected in parallel is dependent on a number of enabled transistors of the plurality of transistors connected in parallel, such as to vary an output bias voltage at the output bias voltage node couple to the amplifier.

15. The method of output power control according to claim 14, wherein sending the different logic signal comprises:
sending one of a logic high signal and a logic low signal to individually enable a number of transistors of the plurality of transistors, and
sending the other of the logic high signal and the logic low signal to individually disable a remaining number of the plurality of transistors.

16. The method of claim 14, further comprising providing a desired output power level in correspondence of an output signal of the amplifier and generating of the logic signals based on the providing of the desired output power level.

17. The method of claim 16, further comprising detecting an output power level of the output signal; based on the detecting, comparing the detected output power level to the desired output power level, and generating the logic signals based on the comparing.

18. The method of claim 16, further comprising mapping an output power level in correspondence of the output signal to the logic signals and generating the logic signals for a desired output power level based on the mapping.

19. The method of claim 18, wherein the mapping is stored as digital data in a mapping table.

20. The method of claim 19, wherein the mapping table further comprises calibration data to compensate for various parameters influencing accuracy of the output power level.

21. The method of claim 20, wherein the various parameters comprise manufacturing variation of a component used in the amplifier and/or a transistor of the plurality of transistors.

\* \* \* \* \*